United States Patent [19]

Samardzija

[11] Patent Number: 4,855,695

[45] Date of Patent: Aug. 8, 1989

[54] AUTOMATED MICROWAVE TUNING SYSTEM FOR DE-EMULSIFIER SYSTEMS

[75] Inventor: Nikola Samardzija, Wilmington, Del.

[73] Assignee: E. I. du Pont de Nemours & Company, Wilmington, Del.

[21] Appl. No.: 187,678

[22] Filed: Apr. 29, 1988

[51] Int. Cl.$^4$ .............................................. H03H 7/40
[52] U.S. Cl. ...................................... 333/17.3; 252/346
[58] Field of Search .......................... 333/17 R, 17 M; 219/10.55 A, 10.65; 252/346; 455/123, 125

[56] References Cited

U.S. PATENT DOCUMENTS

| | | |
|---|---|---|
| 2,640,922 | 6/1953 | McArthur . |
| 2,832,934 | 4/1958 | Walters .............................. 333/17 M |
| 3,617,953 | 11/1971 | Kingma et al. ................... 333/17 M |
| 3,715,690 | 2/1973 | Young et al. ...................... 333/17 R |
| 3,742,394 | 6/1973 | VanKoughnett et al. ... 333/17 M X |
| 4,201,960 | 5/1980 | Skutta et al. ..................... 333/17 M |
| 4,356,458 | 10/1982 | Armitage ......................... 333/17 M |
| 4,532,518 | 7/1985 | Gaglione et al. ............. 333/17 R X |

Primary Examiner—Paul Gensler

[57] ABSTRACT

Apparatus for automatic tuning of microwave energy in a de-emulsifier system usng a wave guide applicator with impedance matching element wherein microwave energy incident on and reflected from the applicator element is continually monitored to derive an indication of voltage standing wave ratio for input to a computer that controls a servo control motor to position a phase shifter thereby to maintain an optimum voltage standing wave ratio and, therefore, maximum efficiency of emulsion irradiation.

5 Claims, 1 Drawing Sheet

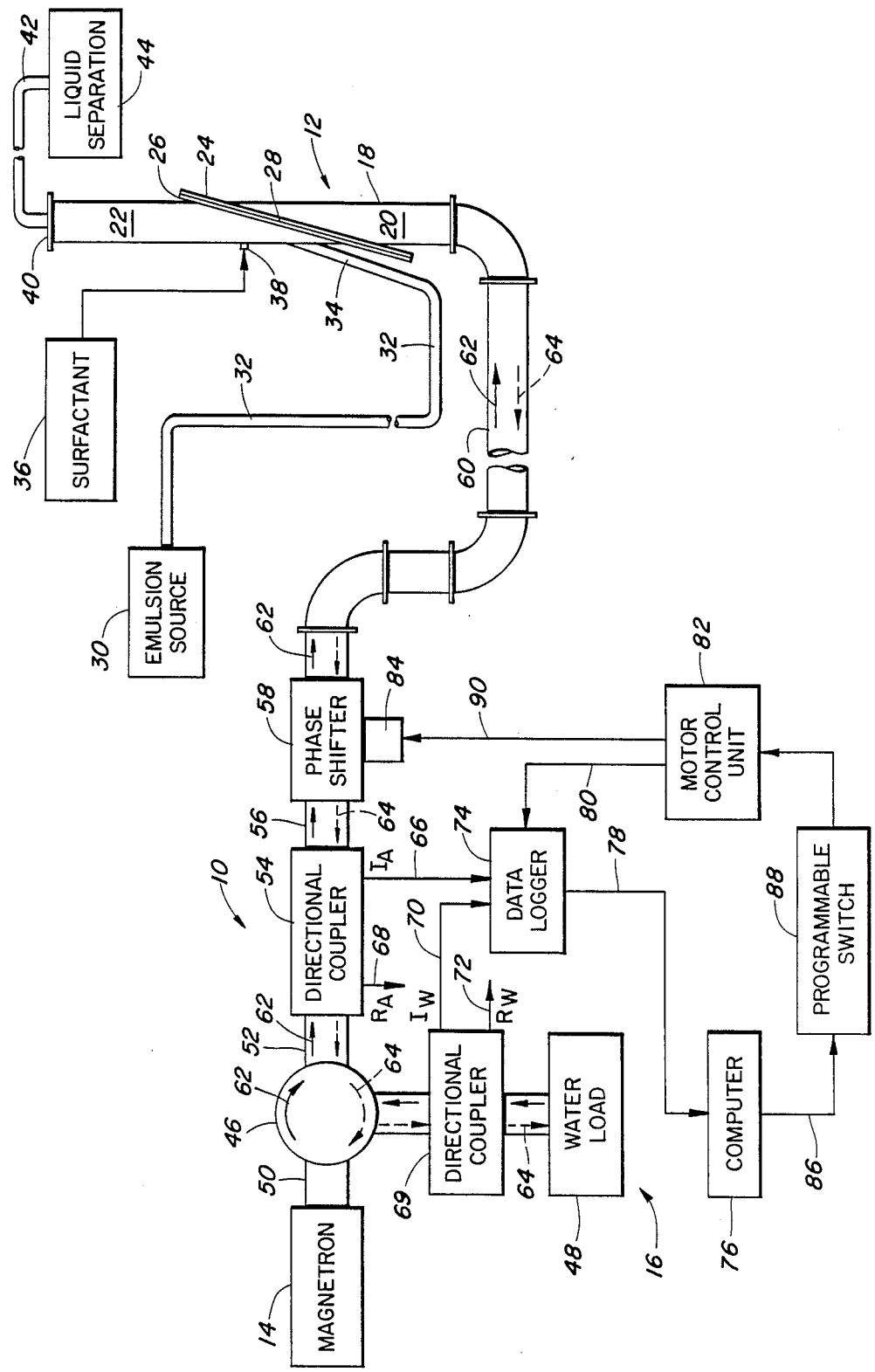

AUTOMATED MICROWAVE TUNING SYSTEM FOR DE-EMULSIFIER SYSTEMS

BACKGROUND OF THE INVENTION

1. Field of the Invention

The invention relates generally to microwave generator frequency control and, more particularly, but not by way of limitation, it relates to an improved microwave energy tuning system for use with microwave liquid treating apparatus utilizing both incident and reflected microwave power 10 indications to effect continuous tuning of the microwave energy applied to an associated applicator structure.

2. Description of the Prior Art

The prior art includes a number of teachings that are directed toward automatic control and changing of the output frequency and/or phase of magnetron devices. U.S. Pat. No. 2,640,922 discloses apparatus for determining the deviation from a center frequency by measuring the voltage differences at two selected points in a standing wave pattern. This was a very early teaching which recognized the utility of a standing wave pattern for monitoring microwave frequency changes in a wave guide or transmission line system. U.S. Pat. No. 2,832,934 provided a teaching of a servo-controlled tuner that was effective to match a transmission line to a load using a control signal that is developed from the directional coupler in response to probe created reflections within the wave guide. This teaching relies upon the insertion of an auxiliary probe in order to obtain an analytic signal which is used as the correction indicator.

U.S. Pat. No. 3,617,953 was directed to a microwave impedance matching system that included a directional coupler for sensing only reflected energy. The system used two phase shifters in separate control loops with respective microwave probe sensors to sense and match the real and imaginary parts of wave guide admittance. Finally, U.S. Pat. No. 3,742,394 covered a microwave tuning system with two probes sensing the standing wave pattern and a servo controlled tuning probe mounted on a slidable carriage to maintain maximum energy transfer in an associated microwave applicator.

SUMMARY OF THE INVENTION

The present invention relates to an automated tuning system for controlling the microwave energy input to microwave applicator apparatus, particularly applicator elements as used in de-emulsifying systems and the like. A servo-loop controlled applicator tuning system functions to compensate for the effects of load impedance changes within a microwave applicator, e.g., impedance fluctuations caused by changes in the amount of water in an oil/water emulsion. The system consists in combination of a microwave energy source connected via a suitable transmission line to introduce microwave energy into a wave guide applicator which functions to irradiate liquid flowing therethrough and which includes a low dielectric constant applicator element adjacent the flowing liquid component. The control system utilizes a directional coupler installed in the wave guide between the microwave source and applicator for the purpose of obtaining both incident and reflected power levels which are then processed through a data logger and computer for derivation of control signals that drive a servo-controlled phase shifter disposed in the wave guide to maintain the system in tune.

Therefore, it is an object of the present invention to provide a microwave heating system for treating flowing liquids with maximum efficiency and safety.

It is also an object of the present invention to provide a microwave irradiation system that can be installed and left for long periods of time without maintenance and oversight.

It is yet further an object of the present invention to provide a microwave tuning system that accurately controls microwave energy phase input to a de-emulsifier applicator.

Finally, it is an object of the invention to provide an apparatus that is simple yet highly reliable and safe for controlling de-emulsifier apparatus containing oil/water systems that may be located at remote locations that are not readily accessible.

Other objects and advantages of the invention will be evident from the following detailed description when read in conjunction with the accompanying drawings which illustrate the invention.

BRIEF DESCRIPTION OF THE DRAWING

The single drawing is a block diagram of a de-emulsifier apparatus with an automatic microwave tuning system.

DETAILED DESCRIPTION OF THE INVENTION

The system 10 consists of applicator apparatus 12 as connected via wave guide to a microwave energy source or magnetron 14 and automatic frequency control apparatus 16. The applicator 12 is fully described and claimed in a patent application Ser. No. 187,667 filed concurrently herewith and entitled "Apparatus For Microwave Separation of Emulsions". The applicator 12 consists of an enclosure or section 18 having wave guide dimensions, actually a section of wave guide of the characteristic frequency that has been further adapted with applicator element and various conduits. The wave guide section 18 consists of a lower void section 20 receiving input of microwave energy and an upper liquid filled section 22 as connected by means of respective angular flanges 24 and 26. A selected-low dielectric constant material is secured between flanges 24, 26 and provides the dividing applicator element 28 in an H-taper configuration or angular bisection across the interior of wave guide section 18. The applicator element 28 may be formed from a selected thickness of silicone rubber, Teflon ® or the like, and the thickness is a matter of selection to accommodate predetermined pressure differentials.

A source of emulsion or dispersion, principally an oil/water emulsion, as retained in a tank or reservoir 30 may be applied under predetermined pressure via conduit 32 to the input tube 34 of applicator section 18. The input liquid is applied at an angle and flowed in closely adjacent the distal side of applicator element 28 thereby to receive the maximum microwave reaction and heating effects. A suitable source of surfactant 36 may also be applied as needed through an input connector 38 disposed intermediate the wave guide upper section 22. Finally, a shorting plate 40, having exit tube 42, is secured across the upper end of wave guide section 22 as the irradiated liquid flows via tube 42 to a suitable reservoir 44 for liquid separation.

Although not necessarily a requirement, the magnetron 14 would be selected from commercially available types having the requisite frequency in keeping with the Medical and Scientific Industrial Standards (MSIS), e.g., 2450 Mhz or 915 Mhz. Depending upon the frequency selected, the wave guide utilized in this system would be selected for the requisite characteristic impedance, i.e., type WR-340 or type WR-975. In one present design, the system includes a magnetron 14 operating at 915 Mhz with 50 Kw output power which is commercially from Microdry Company in San Ramon, Calif. This particular unit also includes the requisite circulator 46 and water load 48 of matched frequency and capacity.

Microwave energy from magnetron 14 is output through a selected stub of wave guide 50 to a circulator 46 which acts as a transmit/receive switch allowing transmitted energy to proceed via wave guide stub 52, directional coupler 54, wave guide 56, phase shifter 58 and connecting wave guide 60 for input to applicator section 18 and incidence on applicator element 28. The phase shifter 58 would function in the same manner if it were placed at the output of magnetron 14 before the circulator 46. The solid line arrow 62 denotes the incident microwave energy to the applicator. Energy reflected from applicator element 28 is denoted by dash-line arrows 64, and this energy returns along the same wave guide directed path to the circulator 4.6 whereupon it is diverted through a directional coupler 69 to the water load 48. Thus, the reflected microwave energy is not allowed to reflect into magnetron 14 but is absorbed or damped in the water load 48.

An analysis of the incident versus reflected microwave energy can be used to define the energy absorption relationship at the applicator section 18 to give an indication of the degree of impedance matching through the applicator element-28. Thus, the quantity of voltage standing wave ratio (VSWR) is monitored to determine how much microwave energy the system is absorbing at applicator section 12. VSWR is equal to the ratio between the reflected energy plus incident energy per the incident energy minus the reflected energy. Therefore, it is apparent that when the reflected energy is equal to zero, the VSWR will be equal to unity, and as the reflected energy increases it is indicated by a higher quantity of VSWR. When reflected energy goes to infinity as when energy incident is equal to energy reflected, a worst situation is present. Therefore, it is desirable to maintain the VSWR below about 3 and closer to 1, and the automatic tuning system 16 prevails to maintain such VSWR value.

Control signals are derived from the directional couplers 54 and 69, each of which are a form of rectifier detector for directional selective energy. The directional coupler 54 provides outputs 66, 68 for $I_A$ and $R_A$ (Reflected-Applicator) signal outputs respectively, and directional coupler 66 provides control outputs 70, 72 for $I_W$ and $R_W$ (Reflected-Water Load), respectively. At directional coupler 54, the output 66 presents $I_A$ signal, i.e., incident energy at the applicator, for input to a data logger 74. Similarly, the directional coupler 69 presents lead 70 and $I_W$ signal, incident energy at the water load or the equivalent of reflected energy from the applicator, for input to the data logger 74. The data logger 74 is a software controlled logic circuit that receives voltage input signals for preparation and input to a computer 76, a relatively simple programmed microprocessor. Data logger 74 receives the rectified signal inputs $I_A$ and $I_W$ on leads 66 and 70 and performs sampling at a predetermined time rate for subsequent analog to digital conversion of the $I_A$ and $I_W$ control signals for input via line 78 to the computer 76. Data logger 74 also receives time analog input via lead 80 from a servo motor control unit 82 which signal indicates present position of servo motor 84 and phase shifter 58. A suitable data logger unit is available from Hewlett-Packard Co. of Menlo Park, Calif.

The computer 76 is programmed to include a predetermined threshold value of VSWR, e.g., a voltage standing wave ratio of 3, which is utilized for comparison with the incident $I_A$ and reflected $I_W$ energy data on line 78 to maintain a VSWR value below the threshold value. The selected VSWR threshold value and related parameters may be set into computer 76 by the operator. A VSWR between 2 and 3 is tolerable but maintaining a VSWR between 2 and 1 is much preferred. Thus, for a threshold value set at VSWR equals 2, the system functions and as the VSWR is detected falling below 2, the servo motor 84 is continually adjusted to maintain VSWR at around 2. Control output from computer 76 by means of lead 86 actuates a programmable switch 88 to output a control signal to energize motor control unit 82 thereby to provide input voltage via lead 90, a servo control voltage, to operate the servo motor 84. The phase shifter 58, operable by means of servo motor 84, is a well known type of wave guide control device used for shifting the phase of microwaves thereby to alter the standing wave ratio.

The foregoing discloses a novel form of microwave heating device that is particularly adapted for the separation or de-emulsification of emulsions and liquid dispersions. The system embodies an automated microwave tuning device which functions to maintain voltage standing wave ratio within a predetermined limit thereby to accommodate most efficient emulsion separation for a given liquid phase mixture, e.g., an oil/water ratio. While the microwave heating apparatus of the present invention utilizes applicators that enable relatively broad band application of microwave energy, the automated tuning device broadens the band width still further to encompass all oil/water mixtures that might be encountered thereby to assure most efficient liquid separation at all times.

Changes may be made in combination and arrangement of elements as heretofore set forth in the specification and shown in the drawings, it being understood that changes may be made in the embodiments disclosed without departing from the spirit and scope of the invention as defined in the following claims.

What is claimed is:

1. Apparatus for automatic tuning control of a microwave irradiation system which consists of a microwave source connected via input wave guide to a fluid applicator containing an impedance matching applicator element, comprising:

a microwave energy source;

a bi-directional circulator receiving output of microwave energy from said source and providing first and second bi-directional microwave connections;

first and second directional couplers connected to said first and second bi-directional microwave connections and providing first and second electrical outputs indicative of energy incident on the applicator element and energy reflected from the applicator element, respectively;

a phase shifter connecting said first directional coupler to said input wave guide;

a dummy load connected to said second directional coupler; and means comparing said first and second electrical outputs to develop a control signal for controlling said phase shifter so that the voltage standing wave ratio is maintained below a predetermined threshold.

2. Apparatus as set forth in claim 1 wherein said means comparing comprises:

a computer means receiving input indications of incident versus reflected microwave energy and developing a value for comparison to a pre-set threshold voltage standing wave ratio to generate a servo control signal; and a servo motor connected to adjust said phase shifter in response to said servo control signal.

3. Apparatus as set forth in claim 2 wherein said computer means comprises:

a data logger receiving input of said first and second outputs from said directional couplers and generating corresponding first and second digital signals;

a computer receiving said first and second digital signals and generating a control signal output;

a motor control unit energizable to develop said servo control signal; and switch means responsive to said control signal output to energize said motor control unit.

4. Apparatus as set forth in claim 3 which further includes:

means connecting servo motor present position indication from said motor control unit to said data logger.

5. De-emulsifier apparatus for separating emulsions and dispersions of liquid, comprising:

a source of microwave energy of selected frequency;

an applicator formed of frequency matching wave guide dimensions and being of preselected length with an impedance matching taper element of low dielectric constant material sealing the applicator into two parts, an input end void chamber and an output end liquid chamber, said applicator having a fluid input tube adjacent said taper element in communication with a fluid output tube leading from the output end liquid chamber;

wave guide structure directing the microwave energy between said source and said applicator input end which further includes:

means for detecting an indication of the voltage standing wave ratio for the wave guide structure;

means for comparing said voltage standing wave ratio indication to a preselected threshold value to derive an error signal; and means responsive to said error signal for shifting the phase of said microwave energy to maintain optimum impedance matching function at said taper element.

* * * * *